US012609657B2

(12) United States Patent     (10) Patent No.:   US 12,609,657 B2

Park et al.     (45) Date of Patent:    Apr. 21, 2026

(54) POWER AMPLIFIER AND ELECTRONIC DEVICE INCLUDING SAME IN WIRELESS COMMUNICATION SYSTEM

(71) Applicant: Samsung Electronics Co., Ltd., Suwon-si (KR)

(72) Inventors: Hyunchul Park, Suwon-si (KR); Seokhyeon Kim, Suwon-si (KR); Byungjoon Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 429 days.

(21) Appl. No.: 18/335,594

(22) Filed: Jun. 15, 2023

(65) Prior Publication Data

US 2023/0336126 A1     Oct. 19, 2023

Related U.S. Application Data

(63) Continuation of application No. PCT/KR2021/019099, filed on Dec. 15, 2021.

(30) Foreign Application Priority Data

Dec. 15, 2020    (KR) ........................ 10-2020-0175792

(51) Int. Cl.
    *H03F 1/02*      (2006.01)
    *H03F 1/56*      (2006.01)
    *H03F 3/24*      (2006.01)

(52) U.S. Cl.
    CPC ........... *H03F 1/0288* (2013.01); *H03F 1/565* (2013.01); *H03F 3/245* (2013.01); *H03F 2200/451* (2013.01)

(58) Field of Classification Search
    CPC ........ H03F 1/0288; H03F 1/565; H03F 3/245; H03F 3/195; H03F 3/211; H03F 3/45475;

(Continued)

(56) References Cited

U.S. PATENT DOCUMENTS 7,602,241 B2    10/2009   Suzuki et al.
7,973,600 B2     7/2011   Yu
                (Continued)

FOREIGN PATENT DOCUMENTS

CN     102986134 A     3/2013
CN     107508560 A    12/2017
                (Continued)

OTHER PUBLICATIONS

Ryu et al., CMOS Doherty Amplifier With Variable Balun Transformer and Adaptive Bias Control for Wireless LAN Application, IEEE Journal of Solid-State Circuits, vol. 49, No. 6, Jun. 2014.

(Continued)

*Primary Examiner* — Andrea Lindgren Baltzell
*Assistant Examiner* — Nareh Shamiryan
(74) *Attorney, Agent, or Firm* — Jefferson IP Law, LLP

(57) ABSTRACT

The disclosure relates to a pre-5th-Generation (5G) or 5G communication system to be provided for supporting higher data rates beyond a 4th-Generation (4G) communication system such as long term evolution (LTE). A Doherty power amplifier in a wireless communication system is provided. The Doherty power amplifier includes a differential carrier amplifier, a differential peaking amplifier, and an output matching circuit. The output matching circuit may include a primary tuning capacitor, a transformer, and a secondary tuning capacitor. The differential carrier amplifier may be connected to the primary tuning capacitor through a carrier capacitor, and inductors, of an output terminal of the differential carrier amplifier. The differential peaking amplifier may be connected to the primary tuning capacitor. The primary tuning capacitor, the inductors, and the carrier capacitor may be configured to function as a quarter-wave transformer.

20 Claims, 8 Drawing Sheets

(58) Field of Classification Search
CPC ............... H03F 3/602; H03F 2200/451; H03F
2200/541; H03F 2200/387
USPC ........................................................ 330/295
See application file for complete search history.

(56) References Cited

U.S. PATENT DOCUMENTS

| | | | |
|---|---|---|---|
| 8,198,938 | B2 | 6/2012 | Yu |
| 2004/0145416 | A1 | 7/2004 | Kwon et al. |
| 2009/0273398 | A1 | 11/2009 | Yu |
| 2013/0027272 | A1 | 1/2013 | Karthaus |
| 2017/0026002 | A1 | 1/2017 | Lyalin |
| 2018/0006612 | A1 | 1/2018 | Van Der Heijden et al. |
| 2020/0228065 | A1 | 7/2020 | Ahn et al. |

FOREIGN PATENT DOCUMENTS

| | | | |
|---|---|---|---|
| JP | 2008-005321 | A | 1/2008 |
| JP | 2009-130897 | A | 6/2009 |
| JP | 2013-085179 | A | 5/2013 |
| JP | 2015-019275 | A | 1/2015 |
| KR | 10-0546491 | B1 | 1/2006 |
| KR | 10-0749870 | B1 | 8/2007 |
| KR | 10-0862056 | B1 | 10/2008 |
| KR | 10-2010-0123615 | A | 11/2010 |
| KR | 10-1671284 | B1 | 11/2016 |
| KR | 10-1910896 | B1 | 10/2018 |
| KR | 10-2165176 | B1 | 10/2020 |
| WO | 2009/066353 | A1 | 5/2009 |
| WO | 2020/163821 | A1 | 8/2020 |

OTHER PUBLICATIONS

Cho et al., A Handy Dandy Doherty PA, IEEE microwave magazine, Sep./Oct. 2017.
Extended European Search Report dated May 13, 2024, issued in European Application No. 21907100.8-1201.
Korean Office Action dated Jun. 24, 2025, issued in Korean Application No. 10-2020-0175792.
Kaymaksut et al., Transformer-Based Doherty Power Amplifiers for mm-Wave Applications in 40-nm CMOS, IEEE Transactions on Microwave Theory and Techniques, vol. 63, No. 4, Apr. 2015.
Hu et al, A 28/37/39GHz Multiband Linear Doherty Power Amplifier in Silicon for 5G Applications, IEEE, 2019.
International Search Report and written opinion dated Apr. 1, 2022, issued in International Application No. PCT/KR2021/019099.
Japanese Office Action dated Dec. 9, 2025, issued in Japanese Application No. 2023-529107.
European Office Action dated Feb. 3, 2026, issued in European Application No. 21907100.8.
Korean Office Action dated Feb. 26, 2026, issued in Korean Application No. 10-2020-0175792.

POWER AMPLIFIER AND ELECTRONIC DEVICE INCLUDING SAME IN WIRELESS COMMUNICATION SYSTEM

CROSS-REFERENCE TO RELATED APPLICATION(S)

This application is a continuation application, claiming priority under § 365(c), of an International application No. PCT/KR2021/019099, filed on Dec. 15, 2021, which is based on and claims the benefit of a Korean patent application number 10-2020-0175792, filed on Dec. 15, 2020, in the Korean Intellectual Property Office, the disclosure of which is incorporated by reference herein in its entirety.

TECHNICAL FIELD

The disclosure relates to a wireless communication system. More particularly, the disclosure relates to a power amplifier and an electronic device including the same in a wireless communication system.

BACKGROUND ART

To meet the demand for wireless data traffic having increased since deployment of $4^{th}$ generation (4G) communication systems, efforts have been made to develop an improved $5^{th}$ generation (5G) or pre-5G communication system. Therefore, the 5G or pre-5G communication system is also called a 'Beyond 4G Network' or a 'Post Long Term Evolution (LTE) System.'

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like.

In the 5G system, hybrid frequency shift keying (FSK) and quadrature amplitude modulation (QAM) modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

To improve communication performance, products equipped with a plurality of antennas are being developed, and it is expected that equipment having a much larger number of antennas will be used by using a massive MIMO technology. As the number of antenna elements in a communication device is increased, the number of RF components (e.g., power amplifiers (PA)) is inevitably increased accordingly to this.

The above information is presented as background information only to assist with an understanding of the disclosure. No determination has been made, and no assertion is made, as to whether any of the above might be applicable as prior art with regard to the disclosure.

DISCLOSURE

Technical Problem

Aspects of the disclosure are to address at least the above-mentioned problems and/or disadvantages and to provide at least the advantages described below. Accordingly, an aspect of the disclosure is to provide a device and method for miniaturization of an amplifier in a wireless communication system.

Another aspect of the disclosure is to provide a Doherty structure for improving the efficiency of a $5^{th}$ generation (5G) radio frequency integrated circuit (RFIC) in a wireless communication system and a device including the same.

Another aspect of the disclosure is to provide a radio frequency (RF) chain for providing a high gain through a structure of a matching circuit which is shared by a carrier amplifier of a Doherty power amplifier and a peaking amplifier thereof in a wireless communication system, and a device including the same.

Additional aspects will be set forth in part in the description which follows and, in part, will be apparent from the description, or may be learned by practice of the presented embodiments.

Technical Solution

In accordance with an aspect of the disclosure, a Doherty power amplifier in a wireless communication system is provided. The Doherty power amplifier includes a differential carrier amplifier, a differential peaking amplifier, and an output matching circuit. The output matching circuit may include a primary tuning capacitor, a transformer, and a secondary tuning capacitor. The differential carrier amplifier may be connected to the primary tuning capacitor through a carrier capacitor, and inductors, of an output terminal of the differential carrier amplifier. The differential peaking amplifier may be connected to the primary tuning capacitor. The primary tuning capacitor, the inductors, and the carrier capacitor may be configured to function as a quarter-wave transformer.

In accordance with another aspect of the disclosure, an RFIC is provided. The RFIC includes a plurality of Radio Frequency (RF) processing chains. Each of the plurality of RF processing chains may include a phase shifter and a Doherty power amplifier. The Doherty power amplifier may include a differential carrier amplifier, a differential peaking amplifier, and an output matching circuit. The output matching circuit may include a primary tuning capacitor, a transformer, and a secondary tuning capacitor. The differential carrier amplifier may be connected to the primary tuning capacitor through a carrier capacitor, and inductors, of an output terminal of the differential carrier amplifier. The differential peaking amplifier may be connected to the primary tuning capacitor.

Advantageous Effects

A device and method of various embodiments of the disclosure may achieve product miniaturization and simultaneously improve amplification efficiency, through a structure in which a carrier amplifier and a peaking amplifier share a matching circuit in a Doherty power amplifier.

Other aspects, advantages, and salient features of the disclosure will become apparent to those skilled in the art from the following detailed description, which, taken in conjunction with the annexed drawings, discloses various embodiments of the disclosure.

DESCRIPTION OF DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

MODE FOR INVENTION

Figure 1A:
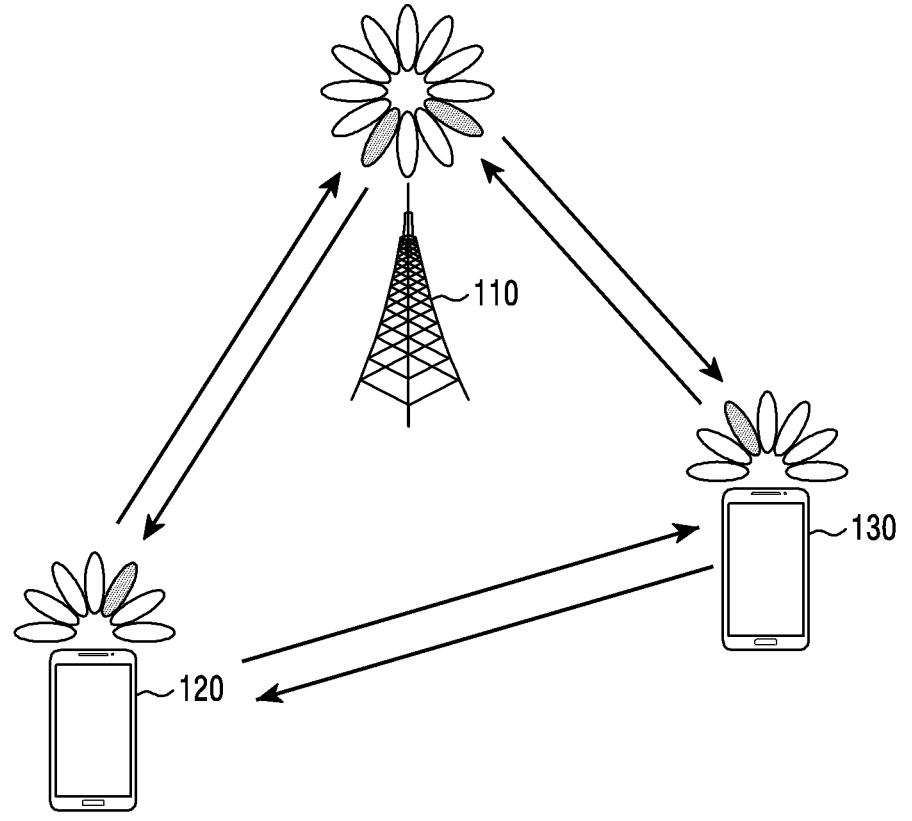
FIG. 1A illustrates a wireless communication system according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

Terms and words used in the following description and claims are not used limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In various embodiments of the disclosure described below, a hardware approach method will be described as an example. However, since various embodiments of the disclosure include a technology that uses both hardware and software, various embodiments of the disclosure do not exclude a software-based approach method.

A term (e.g., a substrate, a plate, a printed circuit board (PCB), a flexible PCB (FPCB), a module, an antenna, an antenna element, a circuit, a processor, a chip, a component, and a device) denoting components of an electronic device used in the following description, a term (e.g., a structure, a structure portion, a support part, a contact part, a protrusion part, and an opening part) denoting the shape of a component, a term (e.g., a connection part, a contact part, a support part, a contact structure, a conductive member, and an assembly) denoting a connection part between structures, a term (e.g., a PCB, an FPCB, a signal line, a feeding line, a data line, an RF signal line, an antenna line, an RF path, an RF module, and an RF circuit) denoting a circuit and the like are exemplified for description's convenience sake. Accordingly, the disclosure is not limited to the terms described below, and other terms having equivalent technological meanings may be used. Also, a term such as ' . . . part', ' . . . unit', ' . . . portion', and ' . . . body' used below may mean at least one shape structure or mean a unit for processing a function.

Also, in the disclosure, to determine whether a specific condition is satisfied or fulfilled, an expression of 'greater than' or 'less than' may be used, but this is only a description for expressing one example and does not exclude the above or following description. A condition mentioned as 'equal to or more than' may be replaced with 'more than,' a condition mentioned as 'equal to or less than' may be replaced with 'less than,' and a condition mentioned as 'equal to or more than and less than' may be replaced with 'more than and equal to or less than.'

Also, although the disclosure describes various embodiments by using terms used in some communication standards (e.g., 3rd Generation Partnership Project (3GPP) and Institute of Electrical and Electronics Engineers (IEEE)), this is only an example for description. Various embodiments of the disclosure may be easily modified and applied in other communication systems.

Hereinafter, the disclosure relates to a power amplifier and an electronic device including the same in a wireless communication system. In detail, the disclosure proposes a Doherty power amplifier instead of a conventional stacked type amplifier, as a power amplifier in a wireless communication system. A description is made for a technology for increasing the efficiency of the Doherty power amplifier and achieving product miniaturization, by combining a carrier amplifier and a peaking amplifier with one output matching circuit and disposing a capacitor and inductors.

FIG. 1A illustrates a wireless communication system according to an embodiment of the disclosure.

Referring to FIG. 1A, a base station 110, a terminal 120, and a terminal 130, as nodes using a wireless channel in a wireless communication system, are illustrated. FIG. 1A illustrates only one base station, but other base stations that are the same as or similar to the base station 110 may be further included.

The base station 110 is a network infrastructure that presents a wireless connection to the terminal 120. The base station 110 has coverage defined as a predetermined geographic area, based on a distance capable of transmitting a signal. The base station 110 may be denoted as, in addition to the base station, a millimeter wave (mmWave) equipment, an 'access point (AP)', an 'eNodeB (eNB)', a '5^th generation node (5G node)', a '5G node B (5G NB)', a 'wireless point', a 'transmission/reception point (TRP)', an 'access unit', a 'divided unit (DU)', a 'transmission/reception point (TRP)', a 'radio unit (RU), a multiple input multiple output (MIMO) unit (MMU), a remote radio head (RRH), or other terms having a technological meaning equivalent to this. The base station 110 may transmit a downlink signal or receive an uplink signal.

The terminal 120 is a device used by a user, and performs communication with the base station 110 through a wireless channel. In some cases, the terminal 120 may be operated without a user's participation. That is, the terminal 120 is a device that performs a machine type communication (MTC) and may not be carried by a user. The terminal 120 may be denoted as a 'user equipment (UE)', a 'mobile station', a 'subscriber station', a 'customer premises equipment' (CPE), a 'remote terminal', a 'wireless terminal', an 'electronic device', a 'vehicle terminal', a 'user device' or other terms having a technological meaning equivalent to this.

The terminal 120 and the terminal 130 illustrated in FIG. 1A may support vehicle communication. In the case of the vehicle communication, in an LTE system, a standardization work for a vehicle-to-everything (V2X) technology has been completed in 3GPP release 14 and release 15 on the basis of a device-to-device (D2D) communication structure, and efforts to develop the V2X technology on the basis of a current 5G new radio (NR) are being made. NR V2X supports a unicast communication between terminals, a groupcast (or multicast) communication, and a broadcast communication.

A power amplifier described in embodiments of the disclosure is a constituent element used for power amplification of a radio frequency (RF), and an operation and construction of the disclosure are described by way of an example of signal transmission in a base station, but embodiments of the disclosure are not limited thereto. A structure of the power amplifier and equipment including the same proposed in the disclosure may be implemented in a terminal as well as the base station. That is, embodiments of the disclosure may be used not only for downlink transmission of the base station but also for uplink transmission of the terminal and sidelink communication of the terminal.

Figure 1B:
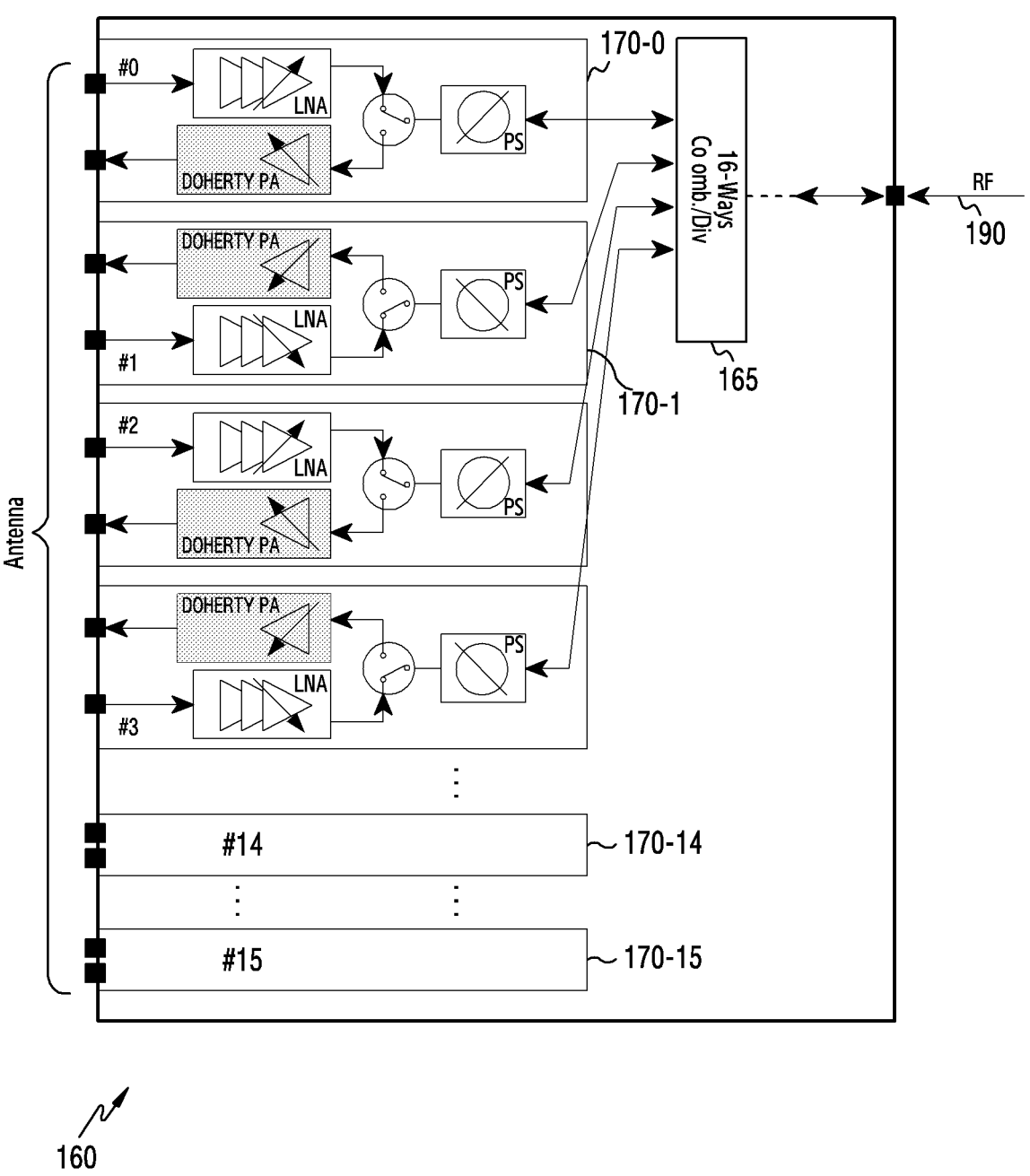
FIG. 1B illustrates an example of a Radio Frequency Integrated Circuit (RFIC) including a power amplifier according to an embodiment of the disclosure.

FIG. 1B illustrates an example of a radio frequency integrated circuit (RFIC) including a power amplifier according to an embodiment of the disclosure.

In 5G communication, a mmWave phased array radio frequency integrated circuit (RFIC) is being developed for efficient communication at a mmWave band. For high communication performance at the mmWave band, the development of a high power, highly efficient, and highly linear power amplifier (PA) (e.g., a complementary metal-oxide-semiconductor (CMOS)/silicon (Si)-based PA) within an integrated circuit (IC) is utilized.

Referring to FIG. 1B, an RFIC 160 may include a plurality of RF chains 170-0, 170-1, . . . 170-14, 170-15. An RF signal 190 inputted to the RFIC 160 may be divided to each RF chain through a divider (or a combiner or a coupler) 165. According to an embodiment, the divider 165 may be configured as a passive element or an active element.

Each of the plurality of RF chains 170-0, 170-1, . . . 170-14, 170-15 may include a phase shifter. The phase shifter may phase-shift a signal that will be transmitted to each antenna element. The RFIC may include a constituent element for a phased array antenna in which an independent phase is set every each radiating element. The phase-shifted signal may be forwarded to a power amplifier.

Each of the plurality of RF chains 170-0, 170-1, . . . 170-14, 170-15 may include a power amplifier. In a wireless communication system, since a transmission signal of a base station or a terminal is forwarded through a wireless channel, serious attenuation is experienced. For this, a transmitter of the base station or terminal may be configured to include an amplifier for amplifying a transmission signal. For amplification of a signal forwarded by air, the power amplifier may be disposed in each of the plurality of RF chains. The power amplifier may amplify an applied signal and forward to an antenna. Although not shown in FIG. 1B, a signal passing through the power amplifier is forwarded to an antenna (e.g., an antenna element of an array antenna) through a filter and a transmission line.

In FIG. 1B, a structure of the RFIC to be proposed through embodiments of the disclosure has been described. A Doherty power amplifier described later with reference to FIGS. 3 to 5 may be disposed inside the RFIC. Also, the Doherty power amplifier described later with reference to FIGS. 3 to 5 may be disposed in each RF chain of the RFIC. On the other hand, the RFIC structure shown in FIG. 1B is only an embodiment for describing a forwarding process from an RF signal input to an antenna. That is, FIG. 1B includes the Doherty power amplifier described later and is not construed as excluding an RFIC having a different structure from FIG. 1B among embodiments of the disclosure.

Figure 2A:
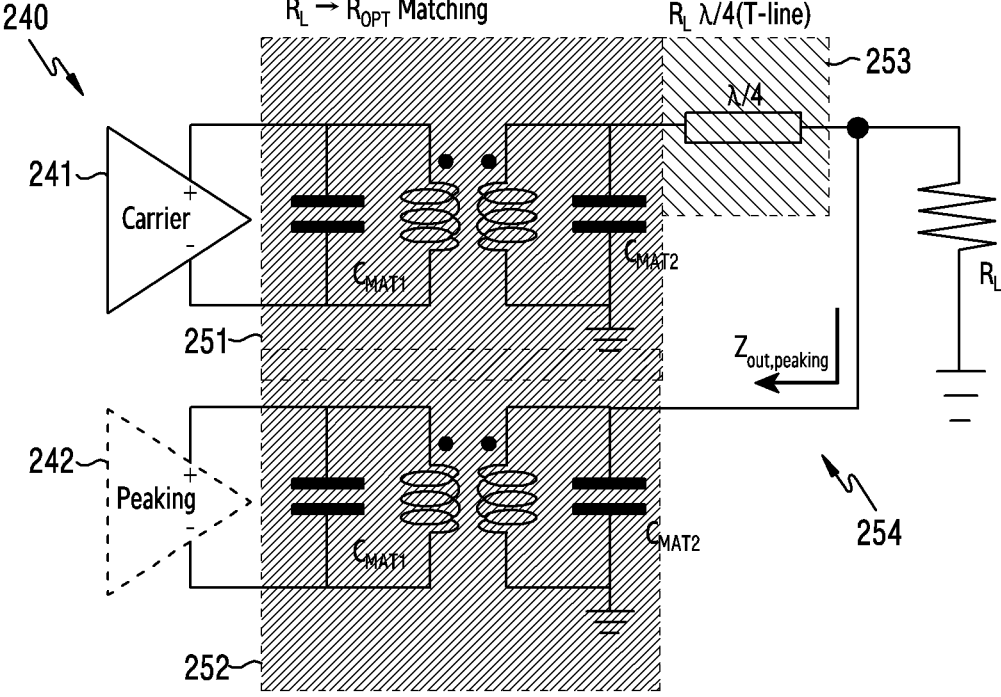
FIGS. 2A and 2B illustrate examples of a power amplifier to be improved through a Doherty structure according to various embodiments of the disclosure.
Figure 2B:
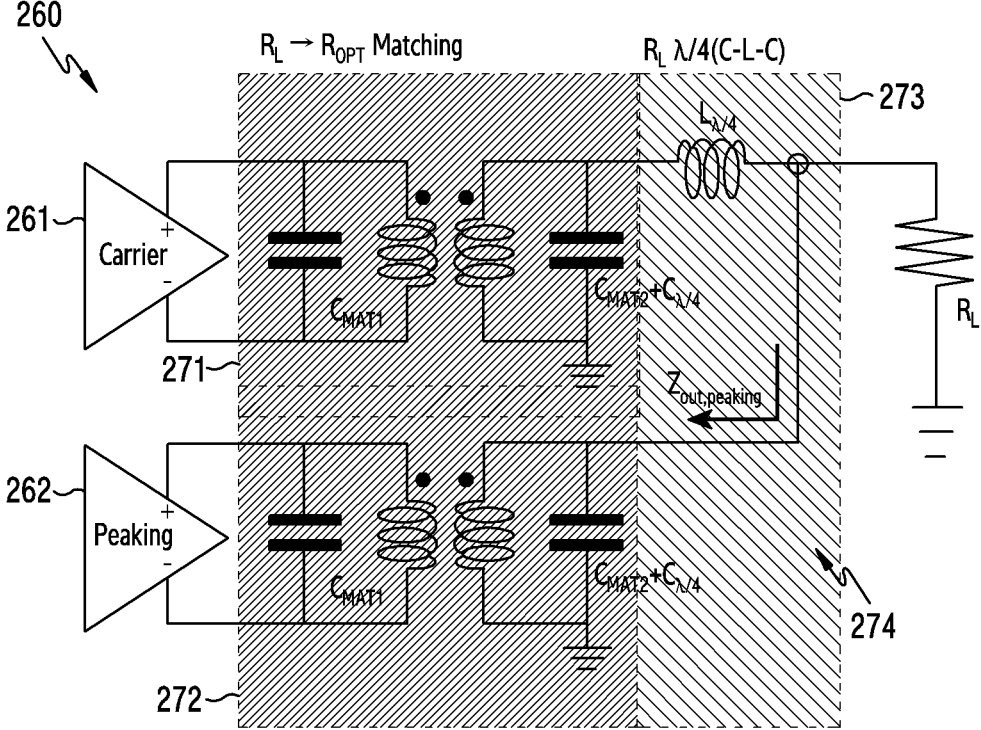

The power amplifier needs to be implemented, within the IC, as many as the number of RF chains required for a phased array (for example, a base station RFIC generally uses 16 to 32 chains). Accordingly, the performance of the power amplifier affects the whole performance of the RFIC. For the sake of high performance and high efficiency, the power amplifier of embodiments of the disclosure may include a Doherty power amplifier. That is, to implement a high-efficient power amplifier, a Doherty structure may be applied to the RFIC. However, there is a problem that it is difficult to apply a general Doherty structure to a mmWave phased array RFIC as it is, as shown in FIGS. 2A and 2B, because of problems such as a wide bandwidth of 5G (e.g., a new radio (NR) signal) and an area limitation of the RFIC, etc. In addition, because the number of power amplifiers required due to an increase of RF paths is also increasing, the miniaturization of the power amplifier is also required. Below, a problem of the existing Doherty power amplifier and a feature to be improved through embodiments of the disclosure are described through FIGS. 2A and 2B.

FIGS. 2A and 2B illustrate examples of a power amplifier (PA) to be improved through a Doherty structure according to various embodiments of the disclosure.

The Doherty power amplifier may include a carrier amplifier and a peaking amplifier. The carrier amplifier may be referred to as a main amplifier and the peaking amplifier may be referred to as an auxiliary amplifier, instead, as well. In general, to maintain high efficiency, the carrier amplifier operates at a low output, and two amplifiers, i.e., the carrier amplifier and the peaking amplifier operate in parallel at a high output. A ratio of the two amplifiers may be varied according to a characteristic of the amplifier. In this case, an impedance matching problem and a power combining problem may occur. To address this, the Doherty power amplifier may include an output matching circuit.

The carrier amplifier is generally a class AB (an operating point moves to a class A bias) or class B (an operating point at a cut-off point of a transistor) amplifier, but the peaking amplifier is generally a class C (an operating point below a cut-off point of a transistor) amplifier and forms a lot of distortion. A bias is adjusted wherein the formed distortion is canceled mutually with a distortion of the carrier amplifier, whereby linearity is maintained. The Doherty power amplifier may include a structure for connecting the carrier amplifier and the peaking amplifier. In this case, the Doherty power amplifier may be connected to a quarter-wave transformer ($\lambda/4$ line). The Doherty power amplifier may have a structure of connecting the carrier amplifier and the peaking amplifier in parallel, based on the quarter-wave transformer. As a power level is increased, an amount of a current supplied from the peaking amplifier to a load may be increased, and the efficiency of the amplifier may be increased through the adjustment and impedance matching of a load impedance of each of the carrier amplifier and the peaking amplifier. Specifically, a basic operating principle of the Doherty power amplifier may be explained through load modulation (or active load pull) by an output current of the peaking amplifier. The operation of the Doherty power amplifier may be divided into three categories: a low power level region, a middle power level region where load modulation occurs, and a maximum power level region. In the low power level region, the peaking amplifier does not operate. The peaking amplifier may be seen as an open circuit. In this case, the carrier amplifier may operate with 2 $R_{opt}$ ($R_{opt}$: the optimum load impedance of the amplifier). As an output power is increased, the efficiency of the carrier amplifier may be increased simultaneously, and be saturated at a 6 dB back-off point from the maximum output level. In the middle power level region, the carrier amplifier may be saturated and be operated with maximum efficiency. When an input power increases and reaches the 6 dB back-off point that is a middle power level, the peaking amplifier may operate. An impedance transformation circuit may provide load modulation from $2R_{opt}$ to $R_{opt}$. In the maximum power level region, a load of the carrier amplifier and peaking amplifier may operate as $R_{opt}$, and each amplifier may supply a half of output power.

Referring to FIGS. 2A and 2B, a structure of a differential Doherty power amplifier is illustrated. Each of the power amplifiers illustrated in FIGS. 2A and 2B includes an output matching circuit that is implemented through a transformer in each of the carrier amplifier and the peaking amplifier, and has a structure for combining an output power through a $\lambda/4$ transformer.

As one example, a first Doherty power amplifier 240 may include a first carrier amplifier 241 and a first peaking amplifier 242. The first carrier amplifier 241 may be connected to a first main matching circuit 251. The first main matching circuit 251 may include a first capacitor ($C_{MAT1}$) for impedance matching, a transformer, and a second capacitor ($C_{MAT2}$) for impedance matching. Similarly, the first peaking amplifier 242 may be connected to a first auxiliary matching circuit 252. The first auxiliary matching circuit 252 may include a first capacitor ($C_{MAT1}$) for impedance matching, a transformer, and a second capacitor ($C_{MAT2}$) for impedance matching. Also, the first Doherty power amplifier 240 may include a quarter-wave transformer 253 for the first carrier amplifier 241. The quarter-wave transformer 253 may be a transmission line having a length of a $\lambda/4$ wave (a quarter-wave). Since a combining structure of the first Doherty power amplifier 240 utilizes at least two transformers and a transmission line having a length of a $\lambda/4$ wavelength, a large area is used for amplifier design. In particular, during a low-power operation in which the first peaking amplifier 242 is deactivated, an impedance ($Z_{out,peaking}$) 254 seen at the output of the first peaking amplifier 242 is greatly varied according to a frequency due to an output capacitance of a transformer and a transistor. This variability causes a degradation of amplifier performance in wideband characteristics. Therefore, the combining structure of the first Doherty power amplifier 240 has a problem that it is not easy to implement the mmWave phased array RFIC.

As one example, a second Doherty power amplifier 260 may include a second carrier amplifier 261 and a second peaking amplifier 262. The second carrier amplifier 261 may be connected to a second main matching circuit 271. The second main matching circuit 271 may include a second capacitor ($C_{MAT1}$) for impedance matching, a transformer, and a second capacitor ($C_{MAT2}+C_{\lambda/4}$) for impedance matching. Similarly, the second peaking amplifier 262 may be connected to a second auxiliary matching circuit 272. The second auxiliary matching circuit 272 may include a second capacitor ($C_{MAT1}$) for impedance matching, a transformer, and a second capacitor ($C_{MAT2}+C_{\lambda/4}$) for impedance matching. Also, the second Doherty power amplifier 260 may include a quarter-wave transformer 273 for the second carrier amplifier 261. The quarter-wave transformer 273 may include at least one lumped element such as an inductor or a capacitor. The quarter-wave transformer 273 may include a capacitor-inductor-capacitor (C-L-C) circuit for impedance matching. In this case, the quarter-wave transformer 273 may use an output capacitor ($C_{MAT2}$) of the transformer. The quarter-wave transformer 273 may include a capacitor ($C_{\lambda/4}$) for impedance transformation and an inductor ($L_{\lambda/4}$) for impedance transformation by using the output capacitor ($C_{MAT2}$). At this time, according to an embodiment, like the sum of capacitors arranged in parallel, a second capacitor may be configured as one. However, even in this case, since an impedance ($Z_{out,peaking}$) 274 seen at the output is varied greatly according to a frequency due to output capacitances of a transformer and a transistor, there is a problem that the second Doherty power amplifier 260 is not suitable for a wideband.

To solve this problem, the disclosure proposes a Doherty output combining structure in which a parasitic output capacitor of an amplifier (e.g., a transistor) is used, a carrier amplifier and a peaking amplifier are combined by a quarter-wave transformer and then an output matching circuit for impedance matching is implemented. By combining the carrier amplifier and the peaking amplifier by the quarter-wave transformer and then implementing the output matching circuit, the number of transformers is reduced to one. Through this, an area of implementation of the amplifier is not only decreased but also a degradation of wideband characteristics is minimized by the transformer. In addition, embodiments of the disclosure propose a method for disposing between the carrier amplifier and the peaking amplifier. Through a symmetrical structure between the two amplifiers, the influence of the asymmetry of the ground (GND) may be minimized in each power amplifier. Also, by increasing space efficiency through the symmetrical structure, it is possible to secure a circuit space for a 2nd harmonic termination or neutralization capacitor which is utilized when designing a differential amplifier having high linearity.

In FIGS. 2A and 2B, a general description of the Doherty power amplifier has been made together for the sake of a structure to be proposed through embodiments of the disclosure. Since the Doherty power amplifier shown in FIGS. 2A and 2B is only an embodiment for explaining a problem of a specific arrangement, the general descriptions (e.g., the carrier amplifier, the peaking amplifier, the back-off operation, and the $R_{opt}$) of the Doherty power amplifier may be applied to a Doherty power amplifier described later through FIGS. 3 to 5, too.

To solve the problem of the conventional structure mentioned through FIGS. 2A and 2B, embodiments of the disclosure, instead of matching (i.e., output matching) the carrier amplifier and the peaking amplifier respectively separately, propose a way for combining outputs of the amplifiers through the quarter-wave transformer and then matching the combined output by using the transformer. Below, a description is made, through FIGS. 3 to 5, for a structure of a Doherty power amplifier for satisfying wideband performance and simultaneously achieving compactness, by using an output matching circuit common to the carrier amplifier and the peaking amplifier and a capacitor of each amplifier for the sake of the quarter-wave transformer.

Figure 3:
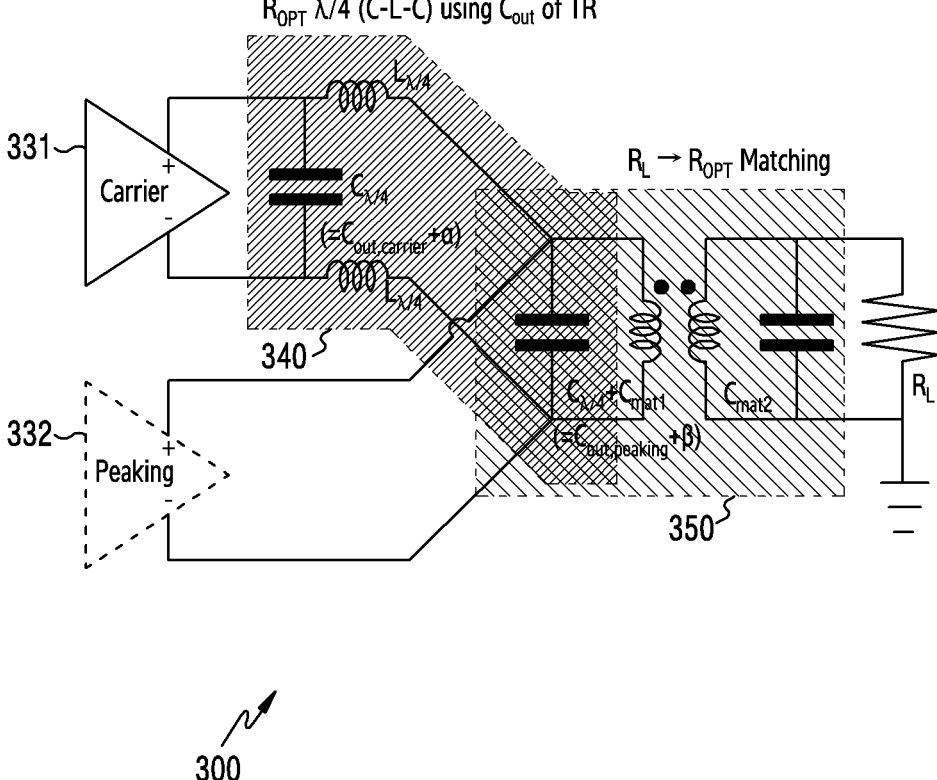
FIG. 3 illustrates an example of a Doherty power amplifier having a common matching circuit according to an embodiment of the disclosure.

FIG. 3 illustrates an example of a Doherty power amplifier having a common matching circuit according to an embodiment of the disclosure.

An orthogonal frequency division multiplexing (OFDM) system provides a high peak to average power ratio (PAPR). 5G NR also uses the OFDM system, and high PAPR problems may continuously occur because of a high-order modulation scheme such as 64 Quadrature Amplitude Modulation (QAM), 1024 QAM, etc. Since the high PAPR has a low back-off power-added efficiency (PAE) efficiency in the power amplifier, the disclosure proposes a Doherty power amplifier. Here, the common matching circuit refers to a matching circuit shared by the carrier amplifier and peaking amplifier of the Doherty power amplifier. In other words, the carrier amplifier and the peaking amplifier do not each have a matching circuit, but may share the same circuit. The common matching circuit may be referred to as an output matching circuit.

Referring to FIG. 3, a Doherty power amplifier 300 may be designed based on two differential-structure power amplifiers. The Doherty power amplifier 300 may include a carrier amplifier 331 and a peaking amplifier 332. According to an embodiment, the carrier amplifier 331 may be configured as a differential amplifier. The carrier amplifier 331 may include an input terminal of a (+) terminal and an input terminal of a (−) terminal, and may be configured to amplify a signal corresponding to a difference between the two input terminals. For example, the carrier amplifier 331 may include a transistor connected to the (+) terminal and a transistor connected to the (−) terminal. According to an embodiment, the peaking amplifier 332 may be configured as a differential amplifier. The peaking amplifier 332 may include an input terminal of a (+) terminal and an input terminal of a (−) terminal, and may be configured to amplify a signal corresponding to a difference between the two input terminals. For example, the peaking amplifier 332 may include a transistor connected to the (+) terminal and a transistor connected to the (−) terminal.

An impedance transformation circuit 340 may be connected to the carrier amplifier 331. The impedance transformation circuit 340 may be configured to be an output impedance ($R_{opt}$) of the carrier amplifier 331 during a Doherty operation (when the peaking amplifier 332 is operated). The $R_{opt}$ means an impedance at which the amplifier may produce a maximum output and efficiency. A phase change by the impedance transformation circuit 340 adds a phase delay component to the input terminal of the peaking amplifier, and matches phases of the carrier amplifier and the peaking amplifier. According to embodiments of the disclosure, the impedance transformation circuit 340 may include a C-L-C connection structure for functioning as a λ/4 transformer. The C-L-C connection structure may include a first capacitor ($C_{λ/4}$) connected in parallel to both output ends of the amplifier, inductors ($L_{λ/4}$) connected in series to the both ends, and a second capacitor ($C_{λ/4}$) connected in parallel after the inductors. The first capacitor ($C_{λ/4}$) for implementing the C-L-C structure is determined by an operating frequency ($f_c$) and an $R_{OPT}$ value, ($C_{λ/4}=1/(2\pi f_c R_{OPT})$). This is implemented by adding a capacitance ($\alpha$ in FIG. 3) to a parasitic output capacitor ($C_{out,carrier}$) of a transistor (TR) of the carrier amplifier 331. Similarly, the second capacitor ($C_{λ/4}$) for implementing the C-L-C structure is implemented by adding a capacitance ($\beta$ in FIG. 3) to a parasitic output capacitor ($C_{out,peaking}$) of a transistor (TR) of the peaking amplifier 332. Each of the carrier amplifier 331 and the peaking amplifier 332 may be comprised of transistors. In this case, the $C_{out,carrier}$ denotes the parasitic output capacitor of the transistor(s) constituting the carrier amplifier 331, and in an actual circuit, only a capacitor corresponding to $\alpha$(F) is added to implement the first capacitor. Similarly, the $C_{out,peaking}$ denotes the parasitic output capacitor of the transistor(s) constituting the peaking amplifier 332, and in an actual circuit, only a capacitor corresponding to $\beta$(F) is added to implement the second capacitor. By setting a value of an output capacitance of the amplifier for the sake of a matching function of the λ/4 transformer (controlling a variable element according to one embodiment, or designing a fixed element according to another embodiment), the carrier amplifier and the peaking amplifier may be combined.

The carrier amplifier 331 and the peaking amplifier 332 may be connected to a common matching circuit 350. In this case, the carrier amplifier 331 is connected to the common matching circuit 350 through the above-described impedance transformation circuit 340, but the peaking amplifier 332 may be directly connected to the common matching circuit 350. In FIG. 3, the impedance transformation circuit is added only to the carrier amplifier 331, but an embodiment of the disclosure is not limited thereto. For example, an impedance transformer may be connected only to the peaking amplifier 332. For another example, different impedance transformers may be configured in the carrier amplifier 331 and the peaking amplifier 332.

The common matching circuit 350 may include a transformer for impedance matching. The transformer may include capacitors in order to control an input to output ratio. The transformer may include a primary capacitor ($C_{MAT1}$) and a secondary capacitor ($C_{MAT2}$) in order to control the input to output ratio. The primary capacitor ($C_{MAT1}$) may be connected in parallel with the second capacitor ($C_{λ/4}$) of the impedance transformation circuit 340. According to an embodiment, to reduce an area of the capacitor, the primary capacitor ($C_{MAT1}$) and the second capacitor ($C_{λ/4}$) may be replaced with one capacitor having a capacitance of the second capacitor ($C_{λ4}+C_{MAT1}$). Since the capacitors connected in parallel may be replaced with one capacitor having the sum of capacitances, the common matching circuit 350 may include a capacitor (hereinafter, a shared capacitor) that functions as a constituent element of an impedance transformer and a primary capacitor of a transformer, together. At this time, it is assumed that a capacitance value additionally required in an input terminal of the transformer and the C-L-C structure is $\beta$. When a capacitance value of a parasitic output capacitor (hereinafter, a peaking capacitor) of a transistor being the peaking amplifier is $C_{out,peaking}$, the shared capacitor may be configured to have a capacitance of $C_{out,peaking}+\beta$ by adding a capacitance of $\beta$. According to an embodiment, the shared capacitor may be disposed as some constituent elements of both the impedance transformation circuit 340 and the common matching circuit 350 for an output matching (matching with a load impedance) function. By setting a value of a capacitance of the shared capacitor of the amplifier (controlling a variable element according to one embodiment, or designing a fixed element according to another embodiment), the carrier amplifier and the peaking amplifier may be combined.

By utilizing output capacitors of the carrier amplifier and the peaking amplifier as some constituent elements of the quarter-wave transformer implemented in the C-L-C, the Doherty power amplifier having the common matching circuit according to embodiments of the disclosure reduces the number of transformers utilized in the conventional structure as shown in FIGS. 2A and 2B, to minimize the area. Also, in addition to the structure in which the carrier amplifier and the peaking amplifier have the common matching circuit 350, the output capacitor of the carrier amplifier and the output capacitor of the peaking amplifier are reused to function as the λ/4 transformer of the Doherty power amplifier, whereby the area of the Doherty power amplifier according to embodiments of the disclosure may be further reduced. In addition, the Doherty power amplifier having the common matching circuit according to embodiments of the disclosure may minimize the degradation of wideband characteristics which occur as the impedance ($Z_{out,peaking}$) 254 of the output terminal of the peaking amplifier 332 changes greatly according to a frequency during low-power operation.

Figure 4:
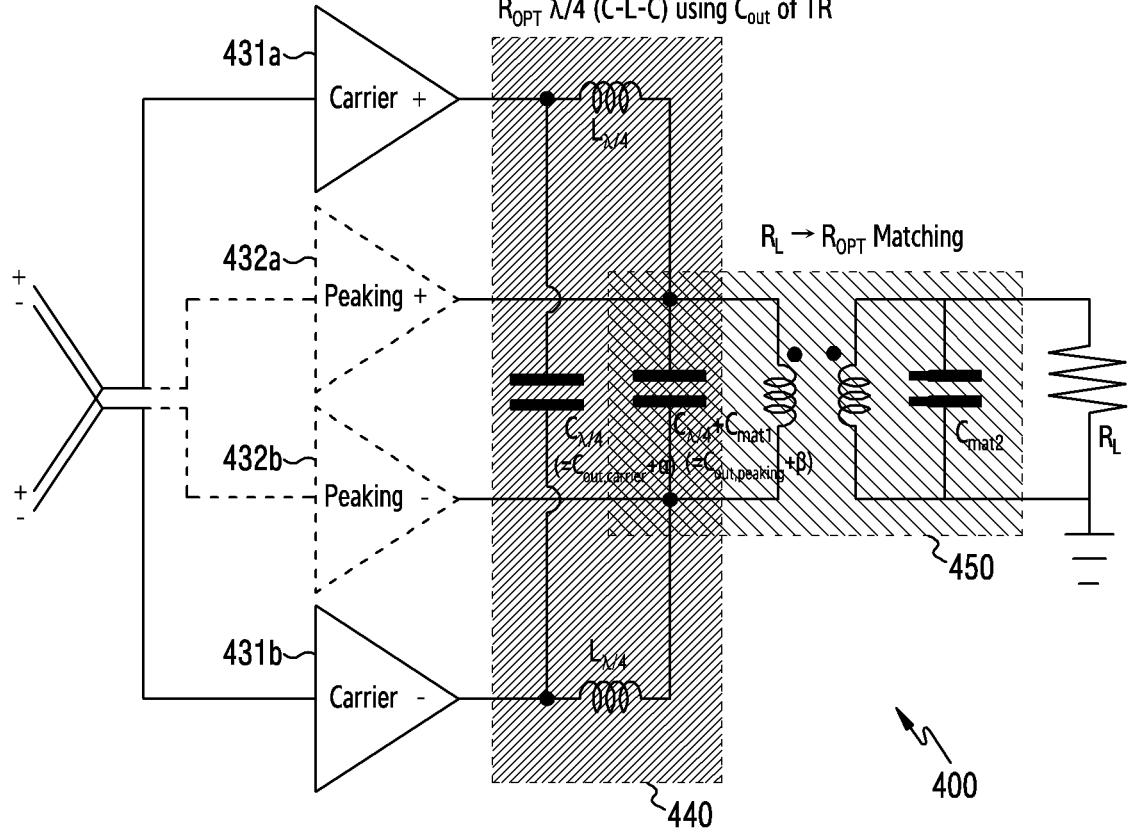
FIG. 4 illustrates an example of a differential pair arrangement of a Doherty power amplifier having a common matching circuit according to an embodiment of the disclosure.

FIG. 4 illustrates an example of a differential pair arrangement of a Doherty power amplifier having a common matching circuit according to an embodiment of the disclosure.

FIG. 4 shows an example of the arrangement of constituent elements in the Doherty power amplifier 300 shown in FIG. 3. That is, a description of the Doherty power amplifier 300 of FIG. 3 may be applied in the same or similar manner.

Referring to FIG. 4, a Doherty power amplifier 400 may be designed based on two differential-structure power amplifiers. The Doherty power amplifier 400 may include a carrier amplifier 431a of a (+) terminal, a carrier amplifier 431b of a (−) terminal, a peaking amplifier 432a of the (+) terminal, and a peaking amplifier 432b of the (−) terminal. For example, the carrier amplifier 431a of the (+) terminal may include a transistor connected to the (+) terminal. The carrier amplifier 431b of the (−) terminal may include a transistor connected to the (−) terminal. Also, for example, the peaking amplifier 432a of the (+) terminal may include a transistor connected to the (+) terminal. The peaking amplifier 432b of the (−) terminal may include a transistor connected to the (−) terminal. Although not shown in FIG. 4, an input signal may be divided and forwarded at an input terminal to the carrier amplifier and the peaking amplifier through a coupler (or a divider or a splitter). An input signal of the (+) terminal may be divided and forwarded to each of the carrier amplifier 431a of the (+) terminal and the peaking amplifier 432a of the (+) terminal. An input signal of the (−) terminal may be divided and forwarded to each of the carrier amplifier 431b of the (−) terminal and the peaking amplifier 432b of the (−) terminal.

An impedance transformation circuit 440 may be disposed at an output terminal of the carrier amplifier. The impedance transformation circuit 440 may be configured to be an output impedance ($R_{opt}$) of the carrier amplifier when the Doherty amplifier operates at a maximum output (when the peaking amplifier operates). The $R_{opt}$ means an impedance at which the amplifier may produce a maximum output and efficiency. The impedance transformation circuit 440 may be implemented to function as a λ/4 transformer. According to embodiments of the disclosure, the impedance transformation circuit 440 may include a C-L-C connection structure for functioning as the λ/4 transformer. The C-L-C connection structure may include a first capacitor ($C_{λ/4}$) connected in parallel to an output terminal of the carrier amplifier 431a (or the transistor) of the (+) terminal and an output terminal of the carrier amplifier 431b (or the transistor) of the (−) terminal, inductors ($L_{λ/4}$) connected in series to each of the output terminal of the carrier amplifier 431a (or the transistor) of the (+) terminal and the output terminal of the carrier amplifier 431b (or the transistor) of the (−) terminal, and a second capacitor ($C_{λ/4}$) connected in parallel after the inductors. The first capacitor ($C_{λ/4}$) for implementing the C-L-C structure is determined by an operating frequency ($f_c$) and an Rom' value, ($C_{λ/4}=1/(2\pi f_c R_{OPT})$). This is implemented by adding a capacitance (α in FIG. 4) to a parasitic output capacitor ($C_{out,carrier}$) of the transistors (TR) of the carrier amplifiers 431a and 431b. Similarly, the second capacitor ($C_{λ/4}$) for implementing the C-L-C structure is implemented by adding a capacitance (β in FIG. 4) to a parasitic output capacitor ($C_{out,peaking}$) of the transistors (TR) of the peaking amplifiers 432a and 432b. By setting a value of an output capacitance of the amplifier for a matching function of the λ/4 transformer (controlling a variable element according to one embodiment, or designing a fixed element according to another embodiment), the carrier amplifier and the peaking amplifier may be combined.

The output terminals of the carrier amplifier 431a of the (+) terminal, the peaking amplifier 432a of the (+) terminal, the carrier amplifier 431b of the (−) terminal, and the peaking amplifier 432b of the (−) terminal may be connected to a common matching circuit 450. At this time, the carrier amplifier 431a of the (+) terminal and the carrier amplifier 431b of the (−) terminal are connected to the common matching circuit 450 through the above-described impedance transformation circuit 440, but the peaking amplifier 432a of the (+) terminal and the peaking amplifier 432b of the (−) terminal may be directly connected to the common matching circuit 450. The common matching circuit 450 may include a transformer for impedance matching. The transformer may include capacitors so as to control an input to output ratio. The transformer may include a primary capacitor ($C_{MAT1}$) and a secondary capacitor ($C_{MAT2}$) so as to control the input to output ratio. The primary capacitor ($C_{MAT1}$) may be connected in parallel with the second capacitor ($C_{λ/4}$) of the impedance transformation circuit 440. According to an embodiment, to reduce an area of the capacitor, the primary capacitor ($C_{MAT1}$) and the second capacitor ($C_{λ/4}$) may be replaced with one capacitor having a capacitance of the second capacitor ($C_{λ/4}+C_{MAT1}$). Since capacitors connected in parallel may be replaced with one capacitor having the sum of capacitances, the common matching circuit 450 may include a capacitor (hereinafter, a shared capacitor) that functions as a constituent element of an impedance transformer and a primary capacitor of a transformer, together. At this time, it is assumed that a capacitance value additionally required at an input terminal of the transformer is β. When a capacitance value of the parasitic output capacitor of the transistor serving as the peaking amplifier is $C_{out,peaking}$, the shared capacitor may be configured to have a capacitance of $C_{out,peaking}+β$. According to an embodiment, the shared capacitor may be disposed as some constituent elements of all of the impedance transformation circuit 440 and the common matching circuit 450 for an output matching (matching with a load impedance)

function. By setting a value of a capacitance of the shared capacitor of the amplifier (controlling a variable element according to one embodiment, or designing a fixed element according to another embodiment), the carrier amplifier and the peaking amplifier may be combined.

To design the power amplifier of embodiments of the disclosure in an RFIC, the lumped elements (e.g., the inductor or the capacitor) and the transistors shown in FIG. 4 are properly arranged. In some embodiments, the proper arrangement may include a symmetrical arrangement of each constituent element. According to an embodiment, for a symmetrical design from the ground (GND), constituent elements of a (+) input terminal and constituent elements of a (−) input terminal may be arranged to be substantially symmetric. This is because a loss experienced by a signal may also vary as a physical line length varies. The impedance transformation circuit 440 and the common matching circuit 450 may be arranged to share a capacitor. The carrier amplifier 431a of the (+) terminal and the peaking amplifier 432a of the (+) terminal may be located at one side centering on a corresponding capacitor, and the carrier amplifier 431b of the (−) terminal and the peaking amplifier 432b of the (−) terminal may be located at the other side. Also, according to an embodiment, the capacitors and the inductors, which are the lumped elements, may also be arranged symmetrically. The inductors located between the output capacitor of the carrier amplifier and the output capacitor of the peaking amplifier may be located at different sides, respectively. Also, according to an embodiment, since one common matching circuit 450 is included in the Doherty power amplifier 400 for the sake of output matching of the carrier amplifier and the peaking amplifier, the common matching circuit 450 may be located in a central region between the constituent elements of the (+) terminal and the constituent elements of the (−) terminal.

In some embodiments, the proper arrangement may include the securing of a free space. According to an embodiment, the power amplifier according to embodiments of the disclosure may further include a circuit (e.g., a low pass filter comprised of L-C) for removing a second harmonic component from the output of each transistor. As the number of transformers is reduced and the number of capacitors is reduced, a mounting area may be reduced. In addition, a free space may be secured through the symmetrical arrangement of the RF constituent elements.

Figure 5:
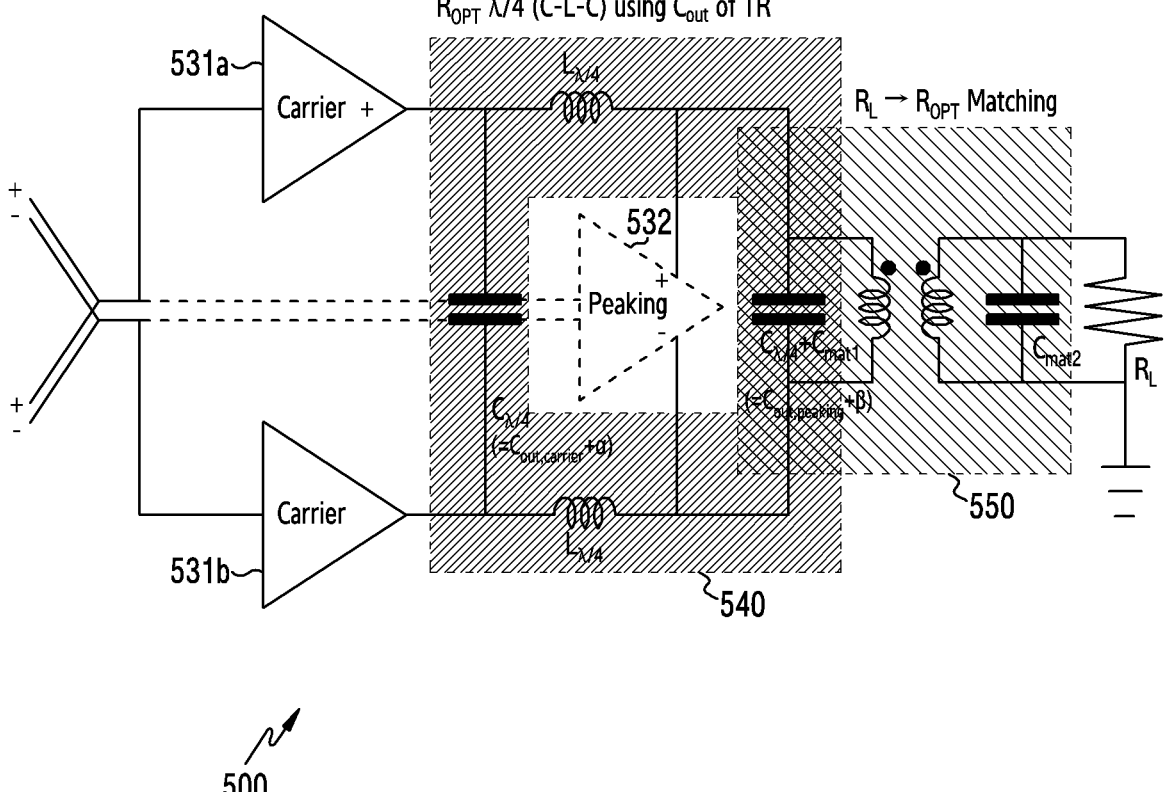
FIG. 5 illustrates another example of a differential pair arrangement of a Doherty power amplifier having a common matching circuit according to an embodiment of the disclosure.

FIG. 5 illustrates another example of a differential pair arrangement of a Doherty power amplifier having a common matching circuit according to an embodiment of the disclosure.

FIG. 5 shows an example of the arrangement of constituent elements in the Doherty power amplifier 300 shown in FIG. 3. That is, a description of the Doherty power amplifier 300 of FIG. 3 may be applied in the same or similar manner.

Referring to FIG. 5, a Doherty power amplifier 500 may be designed based on two differential-structure power amplifiers. The Doherty power amplifier 500 may include a carrier amplifier 531a of a (+) terminal, a carrier amplifier 531b of a (−) terminal, and a peaking amplifier 532. For example, the carrier amplifier 531a of the (+) terminal may include a transistor connected to the (+) terminal. The carrier amplifier 531b of the (−) terminal may include a transistor connected to the (−) terminal. Also, for example, the peaking amplifier 532 may include a transistor connected to the (+) terminal and a transistor connected to the (−) terminal. Although not illustrated in FIG. 5, an input signal may be divided and forwarded at an input terminal to the carrier amplifier and the peaking amplifier through a coupler (or a divider or a splitter). An input signal of the (+) terminal may be divided and forwarded to each of the carrier amplifier 531a and peaking amplifier 532 of the (+) terminal. An input signal of the (−) terminal may be divided and forwarded to each of the carrier amplifier 531b and peaking amplifier 532 of the (−) terminal.

An impedance transformation circuit 540 may be disposed at an output terminal of the carrier amplifier. The impedance transformation circuit 540 may be configured to be an output impedance ($R_{opt}$) of the carrier amplifier when the Doherty amplifier operates at a maximum output (when the peaking amplifier operates). The $R_{opt}$ means an impedance at which the amplifier may produce a maximum output and efficiency. The impedance transformation circuit 540 may be implemented to function as a λ/4 transformer. The impedance transformation circuit 540 may be configured to match phases of the carrier amplifier and the peaking amplifier. For example, the impedance transformation circuit 540 may be configured to include a phase delay component. According to embodiments of the disclosure, the impedance transformation circuit 540 may include a C-L-C connection structure for functioning as the λ/4 transformer. The C-L-C connection structure may include a first capacitor ($C_{\lambda/4}$) connected in parallel to an output terminal of the carrier amplifier 531a (or the transistor) of the (+) terminal and an output terminal of the carrier amplifier 531b (or the transistor) of the (−) terminal, inductors ($L_{\lambda/4}$) connected in series to each of the output terminal of the carrier amplifier 531a (or the transistor) of the (+) terminal and the output terminal of the carrier amplifier 531b (or the transistor) of the (−) terminal, and a second capacitor ($C_{\lambda/4}$) connected in parallel after the inductors. The first capacitor ($C_{\lambda/4}$) for implementing the C-L-C structure is determined by an operating frequency ($f_c$) and an $R_{OPT}$ value, ($C_{\lambda/4}=1/(2\pi f_c R_{OPT})$). This is implemented by adding a capacitance ($\alpha$ in FIG. 4) to a parasitic output capacitor ($C_{out,carrier}$) of the transistors (TR) of the carrier amplifiers 531a and 531b. Similarly, the second capacitor ($C_{\lambda/4}$) for implementing the C-L-C structure is implemented by adding a capacitance ($\beta$ in FIG. 5) to the parasitic output capacitor ($C_{out,peaking}$) of the transistor (TR) of the peaking amplifier 532. By setting a value of an output capacitance of the amplifier for the sake of a matching function of the λ/4 transformer (controlling a variable element according to one embodiment, or designing a fixed element according to another embodiment), the carrier amplifier and the peaking amplifier may be combined.

An output terminal of each of the carrier amplifier 531a of the (+) terminal, the carrier amplifier 531b of the (−) terminal, and the peaking amplifier 532 may be connected to a common matching circuit 550. At this time, the carrier amplifier 531a of the (+) terminal and the carrier amplifier 531b of the (−) terminal are connected to the common matching circuit 550 through the above-described impedance transformation circuit 540, but the peaking amplifier 532 may be directly connected to the common matching circuit 550. The common matching circuit 550 may include a transformer for impedance matching. The transformer may include capacitors so as to control an input to output ratio. The transformer may include a primary capacitor ($C_{MAT1}$) and a secondary capacitor ($C_{MAT2}$) so as to control the input to output ratio. The primary capacitor ($C_{MAT1}$) may be connected in parallel with the second capacitor ($C_{\lambda/4}$) of the impedance transformation circuit 540. According to an embodiment, to reduce an area of the capacitor, the primary capacitor ($C_{MAT1}$) and the second capacitor ($C_{\lambda/4}$) may be replaced with one capacitor having a capacitance of the second capacitor ($C_{\lambda/4}+C_{MAT1}$). Since capacitors connected in parallel may be replaced with one capacitor having the sum of capacitances, the common matching circuit 550 may include a capacitor (hereinafter, a shared capacitor) that functions as a constituent element of an impedance transformer and a primary capacitor of a transformer, together. At this time, it is assumed that a capacitance value additionally required at an input terminal of the transformer is β. When a capacitance value of the parasitic output capacitor of the transistor serving as the peaking amplifier is $C_{out,peaking}$, the shared capacitor may be configured to have a capacitance of $C_{out,peaking}+β$. According to an embodiment, the shared capacitor may be disposed as some constituent elements of all the impedance transformation circuit 540 and the common matching circuit 550 for the sake of an output matching (matching with a load impedance) function. By setting a value of a capacitance of the shared capacitor of the amplifier (controlling a variable element according to one embodiment, or designing a fixed element according to another embodiment), the carrier amplifier and the peaking amplifier may be combined.

To design the power amplifier of embodiments of the disclosure in an RFIC, the lumped elements (e.g., the inductor or the capacitor) and the transistors shown in FIG. 5 are properly arranged. In some embodiments, the proper arrangement may include a symmetrical arrangement of each constituent element. According to an embodiment, for a symmetric design from the ground (GND), constituent elements of a (+) input terminal and constituent elements of a (−) input terminal may be arranged to be substantially symmetric. This is because a loss experienced by a signal may also vary as a physical line length varies. The impedance transformation circuit 540 and the common matching circuit 550 may be arranged to share a capacitor. The carrier amplifier 531*a* of the (+) terminal may be located at one side centering on the corresponding capacitor, and the carrier amplifier 531*b* of the (−) terminal may be located at the other side. Also, according to an embodiment, the capacitors and the inductors, which are the lumped elements, may also be symmetrically disposed. The inductors located between an output capacitor of the carrier amplifier and an output capacitor of the peaking amplifier may be located at different sides, respectively. Also, according to an embodiment, since one common matching circuit 550 is included in the Doherty power amplifier 500 for the sake of output matching of the carrier amplifier and the peaking amplifier, the common matching circuit 550 may be located in a central region between the constituent elements of the (−) terminal and the constituent elements of the (+) terminal. Also, according to an embodiment, the peaking amplifier 532 may be located between the constituent elements of the impedance matching circuit 540. The peaking amplifier 532 may be disposed between elements of the impedance matching circuit 540 for the sake of efficient arrangement at symmetrical design in the Doherty power amplifier 500. For example, the peaking amplifier 532 may be located between the output capacitor of the carrier amplifier 531*a* and the output capacitor of the carrier amplifier 531*b*.

In some embodiments, the proper arrangement may include the securing of a free space. According to an embodiment, the power amplifier of embodiments of the disclosure may further include a circuit (e.g., a low pass filter comprised of L-C) for removing a second harmonic component from the output of each transistor. As the number of transformers is reduced and the number of capacitors is reduced, a mounting area may be reduced. In addition, a free space may be secured through the symmetrical arrangement of the RF constituent elements.

Through FIGS. 3 to 5, as the structure of the Doherty power amplifier, the output matching circuit (i.e., the common matching circuit) shared by the carrier amplifier and the peaking amplifier and the impedance transformation circuit located between the carrier amplifier and the output matching circuit have been proposed. In FIGS. 3 to 5, examples of various arrangement scenarios according to positions of elements of each differential amplifier and/or space securing have been illustrated.

The circuit structures mentioned in FIGS. 3 to 5 may be appropriately selected and used according to requirements in equipment (e.g., a mmWave phased array RFIC, a base station including an RFIC, and a terminal) requiring a power amplifier. According to an embodiment, each constituent element of a Doherty amplification circuit may be disposed according to at least one of a need for a neutralization capacitor besides the common matching circuit and the shared capacitor commonly mentioned through FIGS. 3 to 5, the isolation of an input/output path, and/or whether a second harmonic shorted circuit is required. According to an embodiment, the Doherty power amplifier of embodiments of the disclosure may further include the neutralization capacitor. The neutralization capacitor for solving an inter-electrode capacitance problem occurring in a differential amplifier may be disposed in the Doherty power amplifier. In each transistor, the neutralization capacitor may be disposed to cross an electrode. For example, a capacitor may be disposed between a (+) output terminal and a (−) input terminal. Since the Doherty power amplifier includes a total of four transistors (carrier amplifiers), a circuit structure considering extra space securing or a distance between amplifiers having different electrodes for the sake of the arrangement of additional neutralization capacitors may be used. Also, according to an embodiment, the Doherty power amplifier of embodiments of the disclosure may further include a harmonic removing circuit consisting of an inductor or a capacitor in order to remove a harmonic component provided from the output of each transistor. Since the Doherty power amplifier includes the total of four transistors (carrier amplifiers), a circuit structure for extra space securing for the sake of the arrangement of the additional neutralization capacitors may be used.

The Doherty power amplifier of embodiments of the disclosure described above in FIGS. 3 to 5 may be included in each of the plurality of RF chains 170-0, 170-1, . . . 170-14, 170-15 of FIG. 1B. A signal of each RF chain may pass through the phase shifter and the Doherty power amplifier of embodiments of the disclosure, and be forwarded to the antenna element.

Figure 6:
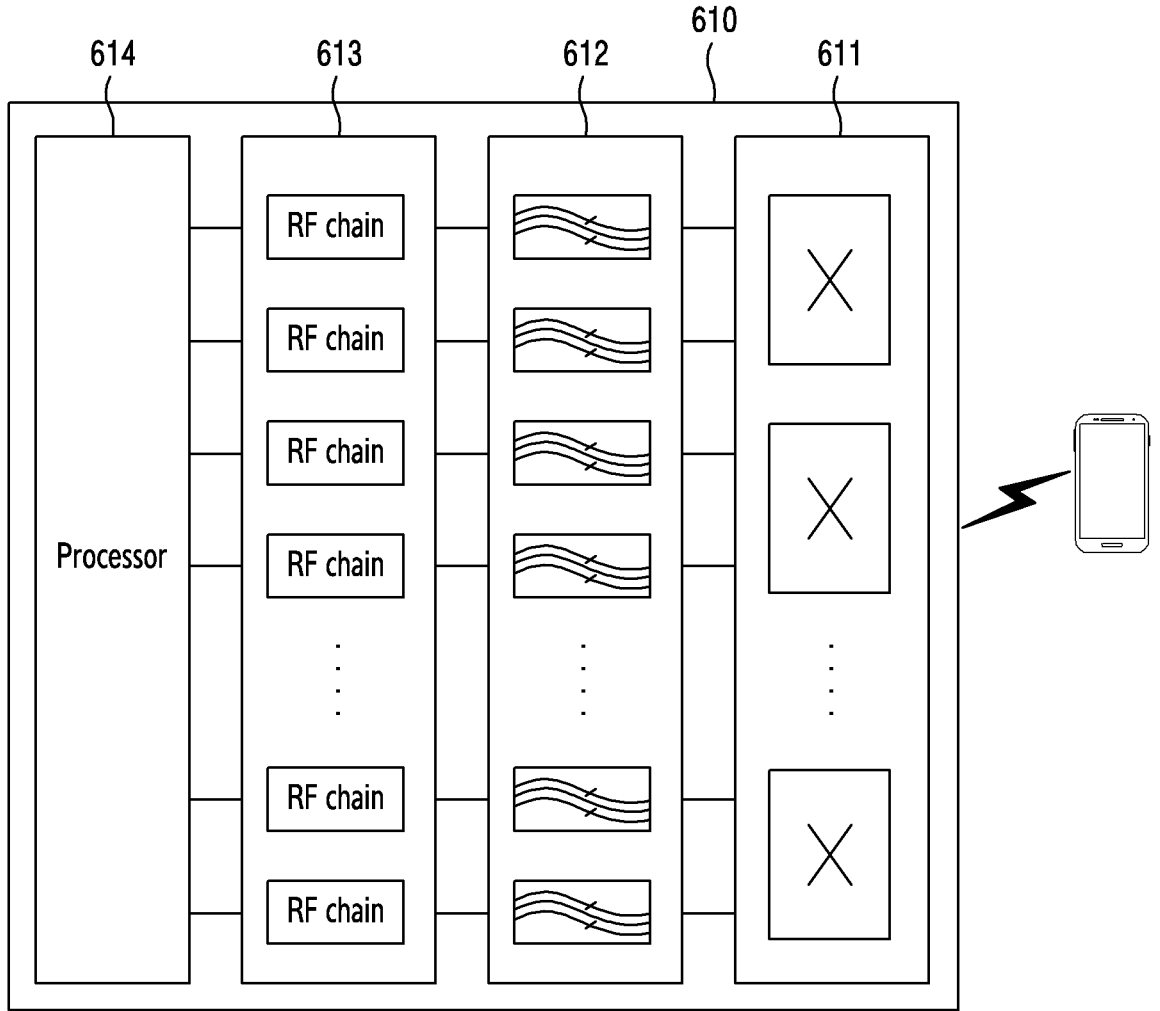
FIG. 6 illustrates a functional construction of an electronic device including a Doherty power amplifier having a common matching circuit according to an embodiment of the disclosure.

FIG. 6 illustrates a functional construction of an electronic device including a Doherty power amplifier having a common matching circuit according to an embodiment of the disclosure.

Referring to FIG. 6, an electronic device 610 may be either a base station 110 or a terminal 120 of FIG. 1A. According to an embodiment, the electronic device 610 may be an RFIC antenna device which includes one or more RF chains at a mmWave band of the base station 110. In addition to the amplifier circuit structure described through FIGS. 1A to 5, the electronic device including the same is also included in embodiments of the disclosure. The electronic device 610 may include, as the RF constituent element, the Doherty power amplifier of a type in which the carrier amplifier and the peaking amplifier mentioned through FIGS. 1A to 5 share the matching circuit.

Referring to FIG. 6, a functional construction of the electronic device 610 is illustrated. The electronic device 610 may include an antenna unit 611, a filter unit 612, a radio frequency (RF) processing unit 613, and a processor (e.g., a control unit) 614.

The antenna unit 611 may include a plurality of antennas. The antenna performs functions for transmitting and/or receiving a signal through a wireless channel. The antenna may include a conductor formed on a substrate (e.g., a PCB) or a radiator formed with a conductive pattern. The antenna may radiate an up-converted signal on the wireless channel or acquire a signal radiated by another device. Each antenna may be referred to as an antenna element or an antenna device. In some embodiments, the antenna unit 611 may include an antenna array in which a plurality of antenna elements form an array. The antenna unit 611 may be electrically connected to the filter unit 612 through RF signal lines. The antenna unit 611 may be mounted on a PCB including a plurality of antenna elements. The PCB may include a plurality of RF signal lines that connect each antenna element and a filter of the filter unit 612. These RF signal lines may be referred to as a feeding network. The antenna unit 611 may present a received signal to the filter unit 612 or may radiate a signal presented from the filter unit 612 into air.

The filter unit 612 may perform filtering so as to forward a signal of a desired frequency. The filter unit 612 may perform a function for selectively identifying a frequency by forming a resonance. The filter unit 612 may include at least one of a band pass filter, a low pass filter, a high pass filter, and a band reject filter. That is, the filter unit 612 may include RF circuits for obtaining a signal of a frequency band for transmission or a frequency band for reception. The filter unit 612 of various embodiments may electrically connect the antenna unit 611 and the RF processing unit 613.

The RF processing unit 613 may include a plurality of RF paths. The RF path may be a unit of a path which a signal received through an antenna or a signal radiated through the antenna passes through. At least one RF path may be referred to as an RF chain. The RF chain may include a plurality of RF elements. The RF elements may include an amplifier, a mixer, an oscillator, a digital-to-analog converter (DAC), an analog-to-digital converter (ADC), and the like. For example, the RF processing unit 613 may include an up converter for up-converting a digital transmission signal of a base band into a transmission frequency, and a DAC for converting the up-converted digital transmission signal into an analog RF transmission signal. The up converter and the DAC form a part of a transmission path. A transmission path may further include a power amplifier (PA) or a coupler (or a combiner). Also, for example, the RF processing unit 613 may include an ADC for converting an analog RF reception signal into a digital reception signal, and a down converter for converting a digital reception signal into a baseband digital reception signal. The ADC and the down converter form a part of a reception path. The reception path may further include a low-noise amplifier (LNA) or a coupler (or a divider). RF parts of the RF processing unit 613 may be implemented on a PCB. The base station (e.g., electronic device 610) may include a structure of being laminated in order of antenna unit 611-filter unit 612-RF processing unit 613. The antennas and the RF parts of the RF processing unit 613 may be implemented on the PCB, and filters may be repeatedly fastened between a PCB and a PCB and form a plurality of layers.

The RF processing unit 613 of various embodiments may include a plurality of RF processing chains for a plurality of signal paths forwarded to the antenna unit 111 and the filter unit 612. An RFIC for mmWave may include the plurality of RF processing chains. A signal applied at a baseband is inputted to the RFIC. The signal inputted to the RFIC is divided to each antenna element. In this case, for the sake of beamforming, an independent phase shift may be applied to each of the antenna elements. Accordingly, the RFIC may include the RF processing chains for processing a signal that will be forwarded to each antenna element. Each RF processing chain may include one or more RF constituent elements for RF signal processing. The RF processing unit 613 may include a Doherty power amplifier in which the carrier amplifier and the peaking amplifier have a common output matching circuit at each RF path of embodiments of the disclosure. The Doherty power amplifier may include a quarter-wave transformer for impedance transformation of the carrier amplifier and the peaking amplifier, which use a tuning capacitor of the output matching circuit.

The processor 614 may control overall operations of the electronic device 610. The processor 614 may include various modules for performing communication. The processor 614 may include at least one processor such as a modem. The processor 614 may include modules for digital signal processing. For example, the processor 614 may include a modem. At data transmission, the processor 614 provides complex symbols by encoding and modulating a transmitted bit stream. Also, for example, at data reception, the processor 614 restores a received bit stream by demodulating and decoding a baseband signal. The processor 614 may perform functions of a protocol stack required by a communication standard.

In FIG. 6, a functional construction of the electronic device 610 has been described as equipment for which the power amplifier of the disclosure may be utilized. However, the example illustrated in FIG. 6 is only a construction for utilization of an antenna structure of various embodiments of the disclosure described through FIGS. 1A to 5, and embodiments of the disclosure are not limited to constituent elements of equipment shown in FIG. 6. Accordingly, an RF module including a power amplifier including an impedance matching circuit, an RFIC, a communication equipment having a different construction, and a structure itself for the power amplifier may also be understood as an embodiment of the disclosure.

In the disclosure, to describe a power amplifier filter and an electronic device including the same, a base station or equipment (e.g., a radio unit (RU) or an access unit (AU)) of the base station for forwarding a signal at a mmWave band has been described as an example, but embodiments of the disclosure are not limited thereto. Undoubtedly, a power amplifier and an electronic device including the same of embodiments of the disclosure are possible for all of a wireless device performing the same function as a base station, a wireless device (e.g., TRP) connected to the base station, the terminal 120, or other communication equipment used for other 5G communication. Also, in the disclosure, an antenna array has been, for example, described as a structure of a plurality of antennas for communication in a multiple input multiple output (MIMO) environment, but it is undoubted that easy change for beamforming is possible in some embodiments.

The conventional stacked PA structure used in a mmWave phased array RFIC is greatly deteriorated in efficiency when using a 5G NR signal having a high PAPR. The Doherty structure is a very effective structure that may improve efficiency when using a signal having a high PAPR, but since the existing differential Doherty structure (e.g., FIGS. 2A and 2B) uses two transformers and a λ/4 transformer, it not only occupies a too large area, but also there is a problem that wideband characteristics are deteriorated at low power operation (peaking amplifier disabling). Embodiments of the disclosure propose a differential Doherty power amplifier structure that is applied to a phased array RFIC in which an area, a wide bandwidth characteristic, and an efficiency are all important. The carrier amplifier and the peaking amplifier are connected to one output matching circuit, and an impedance transformer is implemented between the carrier amplifier and the output matching circuit, thereby reducing an area and reducing a band characteristic degradation.

In the differential Doherty power amplifier having the common matching circuit of embodiments of the disclosure, the carrier amplifier and the peaking amplifier may be connected in series through one or more inductors. Also, according to an embodiment, the differential Doherty power amplifier may include the λ/4 transformer having the C-L-C structure through the one or more inductors, the output capacitor of the carrier amplifier, and the output capacitor of the peaking amplifier. Also, according to an embodiment, the differential Doherty power amplifier may include a circuit in which the λ/4 transformer connected to the carrier amplifier is combined with the peaking amplifier, and a circuit in which the transformer for output matching is connected after combination. Also, according to an embodiment, each of the carrier amplifier and the peaking amplifier may be a differential amplifier, and a (+) component input (positive input) and a (−) component input (negative input) may be physically spaced apart from each other. Thereafter, the outputs of the carrier amplifier and the peaking amplifier may be combined through the common matching circuit. Also, according to an embodiment, each of the above-described inductors may be replaced with a transmission line. In other words, the λ/4 transformer may include a transmission line disposed between both capacitors, instead of the C-L-C structure.

According to embodiments of the disclosure, a Doherty power amplifier in a wireless communication system may include a differential carrier amplifier, a differential peaking amplifier, and an output matching circuit. The output matching circuit may include a primary tuning capacitor, a transformer, and a secondary tuning capacitor. The differential carrier amplifier may be connected to the primary tuning capacitor through a carrier capacitor, and inductors, of an output terminal of the differential carrier amplifier. The differential peaking amplifier may be connected to the primary tuning capacitor. The primary tuning capacitor, the inductors, and the carrier capacitor may be configured to function as a quarter-wave transformer.

In accordance with an embodiment, the differential carrier amplifier may include a first amplifier for a (+) terminal and a second amplifier for a (−) terminal, and the differential peaking amplifier may include a third amplifier for the (+) terminal and a fourth amplifier for the (−) terminal.

In accordance with an embodiment, the carrier capacitor may be connected in parallel to an output terminal of the first amplifier and an output terminal of the second amplifier. The primary tuning capacitor may be connected in parallel to an output terminal of the third amplifier and an output terminal of the fourth amplifier.

In accordance with an embodiment, the inductors may be disposed in series between the carrier capacitor and the primary tuning capacitor.

In accordance with an embodiment, a first inductor connected to the first amplifier among the first amplifier and the inductors may be disposed in a first region of the Doherty power amplifier. A second inductor connected to the second amplifier among the second amplifier and the inductors may be disposed in a second region of the Doherty power amplifier that is different from the first region. The output matching circuit may be disposed between the first region and the second region.

In accordance with an embodiment, the differential peaking amplifier may be disposed between the first region and the second region.

In accordance with an embodiment, the third amplifier of the differential peaking amplifier may be disposed in the first region, and the fourth amplifier may be disposed in the second region.

In accordance with an embodiment, the Doherty power amplifier may further include a ground circuit disposed between the first region and the second region.

In accordance with an embodiment, the primary tuning capacitor may be configured to function as an output capacitor for harmonic removal of the differential peaking amplifier.

In accordance with an embodiment, the output matching circuit may be configured to combine an output of the differential carrier amplifier and an output of the differential peaking amplifier, and match the combined output.

According to embodiments of the disclosure, a radio frequency integrated circuit (RFIC) may include a plurality of radio frequency (RF) processing chains. Each of the plurality of RF processing chains may include a phase shifter and a Doherty power amplifier. The Doherty power amplifier may include a differential carrier amplifier, a differential peaking amplifier, and an output matching circuit. The output matching circuit may include a primary tuning capacitor, a transformer, and a secondary tuning capacitor. The differential carrier amplifier may be connected to the primary tuning capacitor through a carrier capacitor, and inductors, of an output terminal of the differential carrier amplifier. The differential peaking amplifier may be connected to the primary tuning capacitor.

In accordance with an embodiment, the differential carrier amplifier may include a first amplifier for a (+) terminal and a second amplifier for a (−) terminal. The differential peaking amplifier may include a third amplifier for the (+) terminal and a fourth amplifier for the (−) terminal.

In accordance with an embodiment, the carrier capacitor may be connected in parallel to an output terminal of the first amplifier and an output terminal of the second amplifier. The primary tuning capacitor may be connected in parallel to an output terminal of the third amplifier and an output terminal of the fourth amplifier.

In accordance with an embodiment, the inductors may be disposed in series between the carrier capacitor and the primary tuning capacitor.

In accordance with an embodiment, a first inductor connected to the first amplifier among the first amplifier and the inductors may be disposed in a first region of the Doherty power amplifier. A second inductor connected to the second amplifier among the second amplifier and the inductors may be disposed in a second region of the Doherty power amplifier that is different from the first region. The output matching circuit may be disposed between the first region and the second region.

In accordance with an embodiment, the differential peaking amplifier may be disposed between the first region and the second region.

In accordance with an embodiment, the third amplifier of the differential peaking amplifier may be disposed in the first region, and the fourth amplifier may be disposed in the second region.

In accordance with an embodiment, the Doherty power amplifier may include a ground circuit disposed between the first region and the second region.

In accordance with an embodiment, the primary tuning capacitor, the inductors, and the carrier capacitor may be configured to function as a quarter-wave transformer. The primary tuning capacitor may be configured to function as an output capacitor for harmonic removal of the differential peaking amplifier.

In accordance with an embodiment, the output matching circuit may be configured to combine an output of the differential carrier amplifier and an output of the differential peaking amplifier, and match the combined output.

Methods of embodiments described in the claims or specification of the disclosure may be implemented in the form of hardware, software, or a combination of hardware and software.

When implemented in software, a computer-readable storage medium storing one or more programs (software modules) may be presented. The one or more programs stored in the computer-readable storage medium are configured to be executable by one or more processors in an electronic device. The one or more programs include instructions for allowing the electronic device to execute the methods of embodiments described in the claims or specification of the disclosure.

These programs (software modules and/or software) may be stored in a random access memory, a non-volatile memory including a flash memory, a read only memory (ROM), an electrically erasable programmable read only memory (EEPROM), a magnetic disc storage device, a compact disc-ROM (CD-ROM), digital versatile discs (DVDs), an optical storage device of another form, or a magnetic cassette. Or, it may be stored in a memory composed of a combination of some or all thereof. Also, each configuration memory may be included in plurality as well.

Also, the program may be stored in an attachable storage device that may access through a communication network such as the Internet, an intranet, a local area network (LAN), a wide area network (WAN), or a storage area network (SAN), or a communication network consisting of a combination of them. This storage device may be connected to a device performing an embodiment of the disclosure via an external port. Also, a separate storage device on the communication network may be connected to the device performing the embodiment of the disclosure as well.

In the aforementioned concrete embodiments of the disclosure, a constituent element included in the disclosure has been expressed in a singular form or a plural form according to a proposed concrete embodiment. But, the expression of the singular form or plural form is selected suitable to a given situation for description convenience's sake, and the disclosure is not limited to singular or plural constituent elements. Even if a constituent element is expressed in the plural form, the constituent element can be constructed in the singular form, or even if a constituent element is expressed in the singular form, the constituent element can be constructed in the plural form.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. A Doherty power amplifier in a wireless communication system, the Doherty power amplifier comprising:
    a differential carrier amplifier;
    a differential peaking amplifier; and
    an output matching circuit,
    wherein the output matching circuit comprises a primary tuning capacitor, a transformer, and a secondary tuning capacitor,
    wherein the differential carrier amplifier is connected to the primary tuning capacitor through a carrier capacitor, and inductors, of an output terminal of the differential carrier amplifier,
    wherein the differential peaking amplifier is connected to the primary tuning capacitor, and
    wherein the primary tuning capacitor, the inductors, and the carrier capacitor are configured to function as a quarter-wave transformer.

2. The Doherty power amplifier of claim 1,
    wherein the differential carrier amplifier comprises a first amplifier for a (+) terminal and a second amplifier for a (−) terminal, and
    wherein the differential peaking amplifier comprises a third amplifier for the (+) terminal and a fourth amplifier for the (−) terminal.

3. The Doherty power amplifier of claim 2,
    wherein the carrier capacitor is connected in parallel to an output terminal of the first amplifier and an output terminal of the second amplifier, and
    wherein the primary tuning capacitor is connected in parallel to an output terminal of the third amplifier and an output terminal of the fourth amplifier.

4. The Doherty power amplifier of claim 3, wherein the inductors are disposed in series between the carrier capacitor and the primary tuning capacitor.

5. The Doherty power amplifier of claim 2,
    wherein a first inductor connected to the first amplifier among the first amplifier and the inductors is disposed in a first region of the Doherty power amplifier,
    wherein a second inductor connected to the second amplifier among the second amplifier and the inductors is disposed in a second region of the Doherty power amplifier different from the first region, and
    wherein the output matching circuit is disposed between the first region and the second region.

6. The Doherty power amplifier of claim 5, wherein the differential peaking amplifier is disposed between the first region and the second region.

7. The Doherty power amplifier of claim 5,
    wherein the third amplifier of the differential peaking amplifier is disposed in the first region, and
    wherein the fourth amplifier is disposed in the second region.

8. The Doherty power amplifier of claim 5, further comprising a ground circuit disposed between the first region and the second region.

9. The Doherty power amplifier of claim 1, wherein the primary tuning capacitor is configured to function as an output capacitor for harmonic removal of the differential peaking amplifier.

10. The Doherty power amplifier of claim 1, wherein the output matching circuit is configured to:

combine an output of the differential carrier amplifier and an output of the differential peaking amplifier; and match the combined outputs.

11. A radio frequency integrated circuit (RFIC) in a wireless communication system, the RFIC comprising:

a plurality of radio frequency (RF) processing chains, wherein each of the plurality of RF processing chains comprises a phase shifter and a Doherty power amplifier, wherein the Doherty power amplifier comprises a differential carrier amplifier, a differential peaking amplifier, and an output matching circuit, wherein the output matching circuit comprises a primary tuning capacitor, a transformer, and a secondary tuning capacitor, wherein the differential carrier amplifier is connected to the primary tuning capacitor through a carrier capacitor, and inductors, of an output terminal of the differential carrier amplifier, and wherein the differential peaking amplifier is connected to the primary tuning capacitor.

12. The RFIC of claim 11, wherein the differential carrier amplifier comprises a first amplifier for a (+) terminal and a second amplifier for a (−) terminal, and wherein the differential peaking amplifier comprises a third amplifier for the (+) terminal and a fourth amplifier for the (−) terminal.

13. The RFIC of claim 12, wherein the carrier capacitor is connected in parallel to an output terminal of the first amplifier and an output terminal of the second amplifier, and wherein the primary tuning capacitor is connected in parallel to an output terminal of the third amplifier and an output terminal of the fourth amplifier.

14. The RFIC of claim 13, wherein the inductors are disposed in series between the carrier capacitor and the primary tuning capacitor.

15. The RFIC of claim 12, wherein a first inductor connected to the first amplifier among the first amplifier and the inductors is disposed in a first region of the Doherty power amplifier, wherein a second inductor connected to the second amplifier among the second amplifier and the inductors is disposed in a second region of the Doherty power amplifier different from the first region, and wherein the output matching circuit is disposed between the first region and the second region.

16. The RFIC of claim 15, wherein the differential peaking amplifier is disposed between the first region and the second region.

17. The RFIC of claim 15, wherein the third amplifier of the differential peaking amplifier is disposed in the first region, and wherein the fourth amplifier is disposed in the second region.

18. The RFIC of claim 15, wherein the Doherty power amplifier comprises a ground circuit disposed between the first region and the second region.

19. The RFIC of claim 11, wherein the primary tuning capacitor, the inductors, and the carrier capacitor are configured to function as a quarter-wave transformer, and wherein the primary tuning capacitor is configured to function as an output capacitor for harmonic removal of the differential peaking amplifier.

20. The RFIC of claim 11, wherein the output matching circuit is configured to:

combine an output of the differential carrier amplifier and an output of the differential peaking amplifier; and match the combined outputs.

* * * * *